US012009376B2

(12) United States Patent
Lu et al.

(10) Patent No.: US 12,009,376 B2
(45) Date of Patent: Jun. 11, 2024

(54) HIGHLY INTEGRATED TRANSMITTER MODULE FOR LiDAR

(71) Applicant: BEIJING VOYAGER TECHNOLOGY CO., LTD., Beijing (CN)

(72) Inventors: Yue Lu, Mountain View, CA (US); Yu-Ching Yeh, Mountain View, CA (US); Yonghong Guo, Mountain View, CA (US); Youmin Wang, Mountain View, CA (US)

(73) Assignee: BEIJING VOYAGER TECHNOLOGY CO., LTD., Beijing (CN)

( * ) Notice: Subject to any disclaimer, the term of this patent is extended or adjusted under 35 U.S.C. 154(b) by 626 days.

(21) Appl. No.: 17/131,617

(22) Filed: Dec. 22, 2020

(65) Prior Publication Data

US 2022/0199666 A1 Jun. 23, 2022

(51) Int. Cl.
| | |
|---|---|
| *G01C 3/08* | (2006.01) |
| *G01S 7/481* | (2006.01) |
| *G01S 7/4863* | (2020.01) |
| *G01S 17/02* | (2020.01) |
| *H01L 27/146* | (2006.01) |

(Continued)

(52) U.S. Cl.
CPC ........ *H01L 27/14618* (2013.01); *G01S 7/481* (2013.01); *G01S 7/4863* (2013.01); *G01S 17/02* (2013.01); *H01L 27/14607* (2013.01); *H01L 27/14623* (2013.01); *H01S 5/183* (2013.01); *H01S 5/4025* (2013.01)

(58) Field of Classification Search
None
See application file for complete search history.

(56) References Cited

U.S. PATENT DOCUMENTS

| | | | |
|---|---|---|---|
| 11,320,588 B1 * | 5/2022 | Mazed | G16H 10/40 |
| 2017/0307736 A1 * | 10/2017 | Donovan | G01S 7/499 |
| 2021/0405157 A1 * | 12/2021 | Gassend | G01S 7/4972 |

FOREIGN PATENT DOCUMENTS

| | | | | |
|---|---|---|---|---|
| CN | 203967503 U | * | 11/2014 | H01S 3/08 |
| EP | 3700 030 | * | 8/2020 | H01S 5/10 |
| JP | H08110436 A | * | 4/1996 | H01S 3/18 |

(Continued)

*Primary Examiner* — Mark Hellner
(74) *Attorney, Agent, or Firm* — BAYES PLLC

(57) ABSTRACT

Embodiments of the disclosure provide an optical sensing system, an integrated transmitter module for the optical sensing system, and an optical sensing method performed using the optical sensing system. The exemplary optical sensing system includes an integrated transmitter module configured to emit an optical signal into an environment surrounding the optical sensing system. The integrated transmitter module includes a laser emitter, one or more driving integrated circuits, and one or more optics integrated into a chamber that is hermetically sealed. The optical sensing system further includes a photodetector configured to receive the optical signal reflected from the environment and convert the received optical signal to an electrical signal. The optical sensing system additionally includes a readout circuit configured to convert the electrical signal to a digital signal. The photodetector and the readout circuit are located outside the chamber enclosing the integrated transmitter module.

20 Claims, 5 Drawing Sheets

(51) Int. Cl.
*H01S 5/183* (2006.01)
*H01S 5/40* (2006.01)

(56) References Cited

FOREIGN PATENT DOCUMENTS

| | | | | |
|---|---|---|---|---|
| JP | 2020134872 A | * | 8/2020 | ........... G02B 6/4296 |
| WO | WO 2020107164 A1 | * | 11/2018 | ......... H01S 5/02469 |
| WO | WO 2020153182 A1 | * | 7/2020 | ............. H04N 25/75 |

* cited by examiner

S502 EMIT, BY AN INTEGRATED TRANSMITTER MODULE OF AN OPTICAL SENSING SYSTEM, AN OPTICAL SIGNAL INTO AN ENVIRONMENT SURROUNDING THE OPTICAL SENSING SYSTEM, WHEREIN THE INTEGRATED TRANSMITTER MODULE INCLUDES A LASER EMITTER, ONE OR MORE DRIVING INTEGRATED CIRCUITS, AND ONE OR MORE OPTICS INTEGRATED INTO A CHAMBER THAT IS HERMETICALLY SEALED

S504 DETECT, BY A PHOTODETECTOR OF THE OPTICAL SENSING SYSTEM, THE OPTICAL SIGNAL REFLECTED FROM THE ENVIRONMENT, AND CONVERTING, BY THE PHOTODETECTOR, THE DETECTED OPTICAL SIGNAL TO AN ELECTRICAL SIGNAL

S506 CONVERT, BY A READOUT CIRCUIT OF THE OPTICAL SENSING SYSTEM, THE ELECTRICAL SIGNAL TO A DIGITAL SIGNAL, WHEREIN THE PHOTODETECTOR AND THE READOUT CIRCUIT ARE LOCATED OUTSIDE THE CHAMBER ENCLOSING THE INTEGRATED TRANSMITTER MODULE

FIG. 5

HIGHLY INTEGRATED TRANSMITTER MODULE FOR LiDAR

TECHNICAL FIELD

The present disclosure relates to a light detection and ranging (LiDAR) system, and more particularly to, a highly integrated transmitter module for the LiDAR system.

BACKGROUND

A transmitter for a LiDAR system is generally composed of integrated circuits (ICs) driving one or more light sources (e.g., laser source(s)) to emit light signals, followed by optics to shape the light signals to a desired shape (e.g. collimated shape, diverged shape, or any other patterned shape). Conventionally, the driving ICs and respective light sources are soldered on a printed circuit board (PCB) as discrete packages or components, while the optics are mounted on another mechanical structure. The overall structure of the transmitter so formed is thus relatively large, and alignment between the light source and the optics can be very difficult. In addition, due to the discrete packages for the driving ICs, the laser source, and the peripherals (e.g., power) on the PCB, the loop inductance is quite large, making it difficult to achieve a narrow pulse with high peak power. Further, due to the "discrete" nature (e.g., the PCB and the optics are separately packaged), it is challenging to fully seal all discrete transmitter components. Accordingly, environmental changes, such as humidity and temperature changes, may cause optics contamination and misalignment between discrete transmitter components, e.g., due to different thermal stabilities of the PCB containing the laser source and the mechanical structure for holding the optics. This in turn reduces the performance of the transmitter and even further deteriorates the beam shape of the emitted laser signals in the long term. For these reasons, mass production of LiDAR systems is challenging, especially because mass-produced transmitters cannot reliably pass automotive-grade certification tests.

Embodiments of the disclosure address the above concerns by providing an integrated transmitter module that integrates different components of a LiDAR transmitter into a single hermetically sealed chamber.

SUMMARY

In one example, embodiments of the present disclosure include an optical sensing system. The optical sensing system may include an integrated transmitter module, a photodetector, and a readout circuit. The integrated transmitter module may include a laser emitter, one or more driving integrated circuits, and one or more optics integrated into a chamber that is hermetically sealed. The integrated transmitter module may be configured to emit an optical signal into an environment surrounding the optical sensing system. The photodetector may be configured to receive the optical signal reflected from the environment surrounding the optical sensing system and convert the optical signal to an electrical signal. The readout circuit may be configured to convert the electrical signal to a digital signal. The photodetector and the readout circuit may be located outside the chamber enclosing the integrated transmitter module.

In another example, embodiments of the disclosure include an optical sensing method. The optical sensing method includes emitting, by an integrated transmitter module of an optical sensing system, an optical signal into an environment surrounding the optical sensing system. The integrated transmitter module may include a laser emitter, one or more driving integrated circuits, and one or more optics integrated into a chamber that is hermetically sealed. The optical sensing method may further include detecting, by a photodetector of the optical sensing system, the optical signal reflected from the environment surrounding the optical sensing system, and converting, by the photodetector, the detected optical signal to an electrical signal. The optical sensing method may additionally include converting, by a readout circuit of the optical sensing system, the electrical signal to a digital signal. The photodetector and the readout circuit may be located outside the chamber enclosing the integrated transmitter module.

In a further example, embodiments of the disclosure include an integrated transmitter module for an optical sensing system. The integrated transmitter module may include a laser emitter configured to emit an optical signal to an environment surrounding the optical sensing system. The integrated transmitter module may further include one or more driving integrated circuits configured to drive the laser emitter to emit the optical signal. The integrated transmitter module may additionally include one or more optics configured to shape the optical signal into a predefined shape for emitting to the environment. The laser emitter, the one or more driving integrated circuits, and the one or more optics may be integrated into a hermetically sealed chamber.

It is to be understood that both the foregoing general description and the following detailed description are exemplary and explanatory only and are not restrictive of the disclosure, as claimed.

BRIEF DESCRIPTION OF THE DRAWINGS

FIG. 5 is a flow chart of an exemplary optical sensing method performed using a LiDAR system containing an integrated transmitter module, according to embodiments of the disclosure.

DETAILED DESCRIPTION

Figure 1:
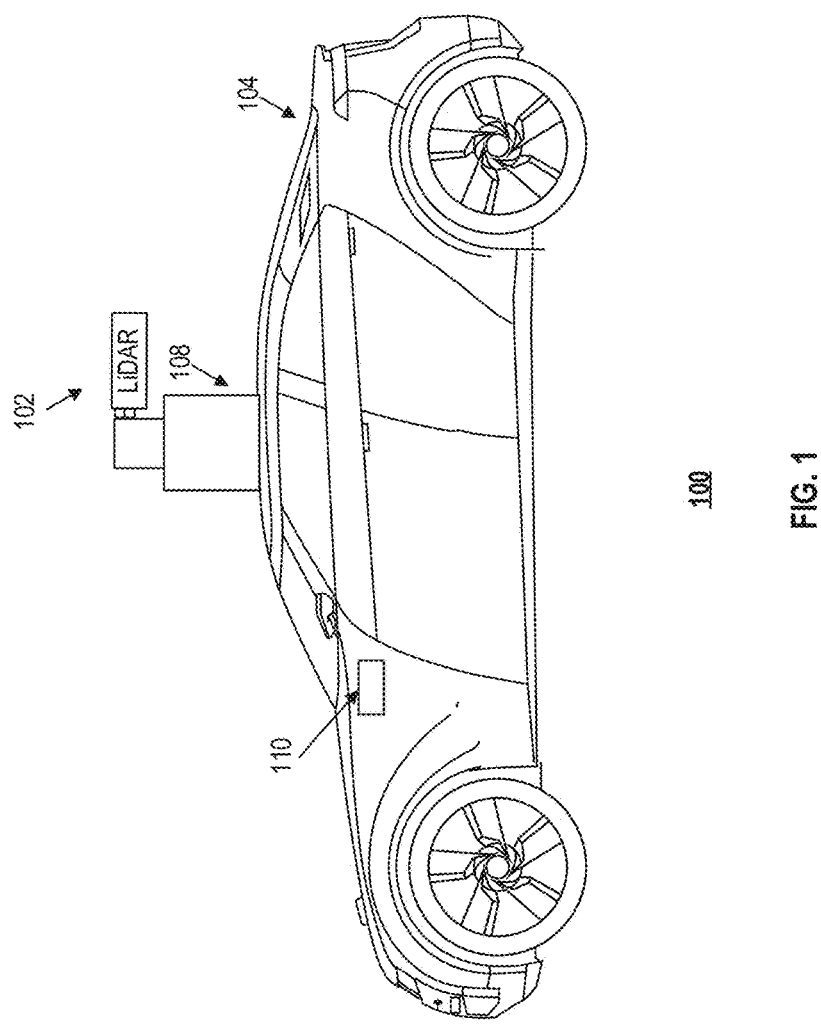
FIG. 1 illustrates a schematic diagram of an exemplary vehicle equipped with a LiDAR system containing an integrated transmitter module, according to embodiments of the disclosure.

Reference will now be made in detail to the exemplary embodiments, examples of which are illustrated in the accompanying drawings. Wherever possible, the same reference numbers will be used throughout the drawings to refer to the same or like parts.

Embodiments of the present disclosure provide integration of several transmitter components of a LiDAR system into a single package (e.g., a chamber) that can be sealed or even hermetically sealed. According to one example, the transmitter components include a laser emitter, one or more driving ICs for the laser emitter, and the corresponding optics, all of which are integrated inside a single hermetically sealed chamber, e.g., a metal package similar to a butterfly package used in optical telecommunications. All of the transmitter components may be disposed on a same PCB and/or another substrate inside the hermetically sealed chamber.

The sealed package enclosing therein integrated transmitter components may be referred to as an "integrated transmitter module." Such an integrated transmitter module may offer many advantages compared to discrete or separately packaged transmitter components in existing LiDAR systems. First, the integrated transmitter module eliminates the need for individually packaging components (e.g., driving ICs, laser emitter, capacitor, power supply) for the transmitter. Second, parasitic inductance of the transmitter components can be greatly reduced by integrating these components into a same package instead of keeping them separated, especially when there are multi-channel laser sources in a transmitter. The reduction of the parasitic inductance can improve the quality of the signal pulses generated by the transmitter (e.g., generating a narrower pulse with a higher peak power). Third, alignment accuracy within a single package may be improved due to the close distance among relevant components inside the same package. Moreover, the alignment may be easier to carry out automatically through active alignment technology due to the integration of multiple transmitter components in a confined space. Fourth, for such a small package, thermal expansion, which usually causes system-level alignment drift, can be greatly reduced especially when a low-thermal-expansion board is introduced for integrating the multiple transmitter components. Fifth, due to the hermetical sealing, environmental changes such as humidity change that normally causes optics contamination can be prevented. This also makes the automotive-grade certification of integrated transmitter modules possible. Sixth, the packaged transmitter components do not require further manual manipulation (e.g., alignment) after production, facilitating mass production of the integrated transmitter components as a single product. The features and advantages described herein are exemplary and not all-inclusive.

The disclosed LiDAR system with an integrated transmitter module can be used in many applications. For example, the disclosed LiDAR system can be used in advanced navigation technologies, such as to aid autonomous driving or to generate high-definition maps, in which the disclosed LiDAR system can be used as an optical sensing system equipped on a vehicle.

FIG. 1 illustrates a schematic diagram of an exemplary vehicle equipped with an optical sensing system containing an integrated transmitter module, according to embodiments of the disclosure. Consistent with some embodiments, vehicle 100 may be a survey vehicle configured for acquiring data for constructing a high-definition map or 3-D buildings and city modeling. Vehicle 100 may also be an autonomous driving vehicle.

As illustrated in FIG. 1, vehicle 100 may be equipped with an optical sensing system (e.g., a LiDAR system) 102 (also referred to as "LiDAR system 102" hereinafter) mounted to a body 104 via a mounting structure 108. Mounting structure 108 may be an electro-mechanical device installed or otherwise attached to body 104 of vehicle 100. In some embodiments of the present disclosure, mounting structure 108 may use screws, adhesives, or another mounting mechanism. Vehicle 100 may be additionally equipped with a sensor 110 inside or outside body 104 using any suitable mounting mechanisms. Sensor 110 may include sensors used in a navigation unit, such as a global positioning system (GPS) receiver and one or more inertial measurement unit (IMU) sensors. It is contemplated that the manners in which LiDAR system 102 or sensor 110 can be equipped on vehicle 100 are not limited by the example shown in FIG. 1 and may be modified depending on the types of LiDAR system 102 and sensor 110 and/or vehicle 100 to achieve desirable 3D sensing performance.

Consistent with some embodiments, LiDAR system 102 and sensor 110 may be configured to capture data as vehicle 100 moves along a trajectory. For example, an integrated transmitter module of LiDAR system 102 may be configured to scan the surrounding environment. LiDAR system 102 measures distance to a target by illuminating the target with laser beams and measuring the reflected/scattered laser signals with a receiver. The laser beams used for LiDAR system 102 may be ultraviolet, visible, or near-infrared, and may be pulsed or continuous wave laser beams. In some embodiments of the present disclosure, LiDAR system 102 may capture point clouds including depth information of the objects in the surrounding environment, which may be used for constructing a high-definition map or 3-D buildings and city modeling. As vehicle 100 moves along the trajectory, LiDAR system 102 may continuously capture data including the depth information of the surrounding objects (such as moving vehicles, buildings, road signs, pedestrians, etc.) for a map, building, or city modeling construction.

Figure 2:
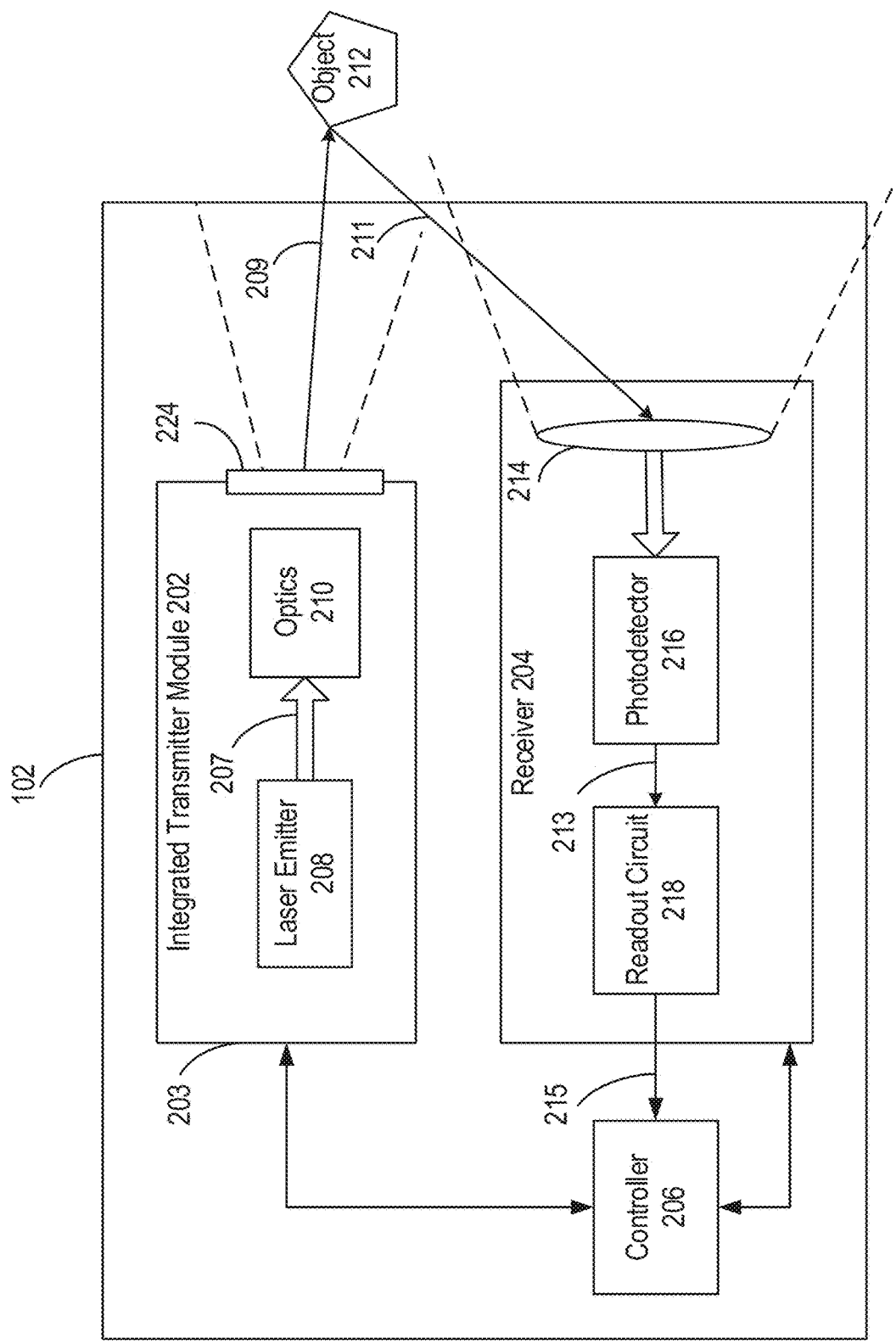
FIG. 2 illustrates a block diagram of an exemplary LiDAR system containing an integrated transmitter module, according to embodiments of the disclosure.

FIG. 2 illustrates a block diagram of an exemplary LiDAR system containing an integrated transmitter module, according to embodiments of the disclosure. As illustrated, LiDAR system 102 may include an integrated transmitter module 202, a receiver 204, and a controller 206 coupled to integrated transmitter module 202 and receiver 204. Integrated transmitter module 202 may include transmitter components integrated into a single package. For instance, integrated transmitter module 202 may include a laser emitter 208 and one or more optics 210 integrated into a single hermetically sealed chamber 203.

Integrated transmitter module 202 may emit optical beams (e.g., pulsed laser beams, continuous wave (CW) beams, frequency modulated continuous wave (FMCW) beams, etc.) along multiple directions. Integrated transmitter module 202 may include one or more laser sources (e.g., laser emitter 208) for emitting laser beams and one or more optics 210 for shaping (e.g., by changing optical directions) the emitted laser beams into a specific shape. According to one example, integrated transmitter module 202 may sequentially emit a stream of laser beams in different directions within a scan filed-of-view (FOV) (e.g., a range in angular degrees), as illustrated by dotted-dashed lines in FIG. 2.

Laser emitter 208 may be configured to emit laser beams 207 (also referred to as "native laser beams") to optics 210. For instance, laser emitter 208 may generate laser beams in the ultraviolet, visible, or near-infrared wavelength range, and provide the generated laser beams to optics 210. In some embodiments of the present disclosure, depending on underlying laser technology used for generating laser beams, laser emitter 208 may include one or more of a double heterostructure (DH) laser emitter, a quantum well laser emitter, a quantum cascade laser emitter, an interband cascade (ICL) laser emitter, a separate confinement heterostructure (SCH) laser emitter, a distributed Bragg reflector (DBR) laser emitter, a distributed feedback (DFB) laser emitter, a vertical-cavity surface-emitting laser (VCSEL) emitter, a vertical-external-cavity surface-emitting laser (VECSEL) emitter, an extern-cavity diode laser emitter, etc., or any combination thereof. Depending on the number of laser emitting units in a package, laser emitter 208 may include a single emitter containing a single light-emitting unit, a multi-emitter unit containing multiple single emitters packaged in a single chip, an emitter array or laser diode bar containing multiple (e.g., 10, 20, 30, 40, 50, etc.) single emitters in a single substrate, an emitter stack containing multiple laser diode bars or emitter arrays vertically and/or horizontally built up in a single package, etc., or any combination thereof. Depending on the operating time, laser emitter 208 may include one or more of a pulsed laser diode (PLD), a CW laser diode, a Quasi-CW laser diode, etc., or any combination thereof. Depending on the semiconductor materials of diodes in laser emitter 208, the wavelength of incident laser beams 207 may be at different values, such as 405 nm, between 445 nm and 465 nm, between 510 nm and 525 nm, 532 nm, 635 nm, between 650 nm and 660 nm, 670 nm, 760 nm, 785 nm, 808 nm, 848 nm, 870 nm, 905 nm, 940 nm, 980 nm, 1064 nm, 1083 nm, 1310 nm, 1370 nm, 1480 nm, 1512 nm, 1550 nm, 1625 nm, 1654 nm, 1877 nm, 1940 nm, 2000 nm, etc. It is understood that any suitable laser source may be used as laser emitter 208 for emitting laser beams 207 at a proper wavelength.

Optics 210 may include optical components (e.g., lenses, mirrors) that can shape the laser light (e.g., laser beams 207), e.g., collimate the laser light into a narrow laser beam 209, to increase scan resolution and/or scan range. In some embodiments, integrated transmitter module 202 may also include a scanner (not shown) configured to alter the emission angle of laser beams 209 to scan the FOV of integrated transmitter module 202 to detect an object 212 in the surrounding environment.

Object 212 may be made of a wide range of materials including, for example, non-metallic objects, rocks, rain, chemical compounds, aerosols, clouds, and even single molecules. The wavelength of laser beams 209 may be adjusted based on the composition of object 212. In some embodiments, at each time point during the scan, the scanner may emit laser beams 209 to object 212 in a direction within a range of scanning angles by rotating a deflector, such as a micromachined mirror assembly (not shown).

In some embodiments, for laser beams to be emitted from optics 210 inside chamber 203, which may be hermetically sealed, to object 212 outside the chamber, chamber 203 of integrated transmitter module 202 may include a glass window 224 for light emission. That is, emitted laser beams 209 may pass through glass window 224 of chamber 203 to reach object 212 in the surrounding environment of LiDAR system 102.

Receiver 204 may be configured to detect returned laser beams 211 returned from object 212. Upon contact with object 212, laser light can be reflected/scattered by object 212 via backscattering, such as Rayleigh scattering, Mie scattering, Raman scattering, and fluorescence. Returned laser beams 211 may be in a same or different direction from laser beams 209. For instance, in some embodiments, receiver 204 may also be disposed within the sealed chamber 203 to detect returned laser beams 211 that may be in a same direction (albeit opposite) as laser beams 209. On the other hand, receiver 204 may not be located within the sealed chamber 203 to detect the returned laser beams that may be in a different direction from laser beams 209. In some embodiments, after receiving laser beams returned from object 212, receiver 204 may process the received laser beams and output signals reflecting the intensity of returned laser beams 211.

In some embodiments, receiver 204 may include a lens 214, a photodetector 216, and a readout circuit 218. Lens 214 may be configured to collect light from a respective direction in a receiver FOV and converge the returned laser beams 211 to focus on photodetector 216. At each time point during the scan, returned laser beams 211 may be collected by lens 214. Returned laser beams 211 may be returned from object 212. The pulses in returned laser beam 211 may have the same waveform (e.g., bandwidth and wavelength) as those in laser beams 209.

Photodetector 216 may be configured to detect returned laser beams 211 returned from object 212 and converged by lens 214. In some embodiments, photodetector 216 may convert the laser light (e.g., returned laser beams 211) converged by lens 214 into an electrical signal 213 (e.g., a current or a voltage signal). Electrical signal 213 may be an analog signal, or even a digital signal in some embodiments, which is generated when photons are absorbed in a photosensor included in photodetector 216. In some embodiments, photodetector 216 may include a PIN detector, an avalanche photodiode (APD) detector, a single-photon avalanche diode (SPAD) detector, a silicon photo multiplier (SiPM) detector, or the like.

Readout circuit 218 may be configured to integrate, amplify, filter, and/or multiplex signals detected by photodetector 216 and transfer the integrated, amplified, filtered, and/or multiplexed signal 215 to controller 206 for further processing. In some embodiments, readout circuit 218 may act as an interface between photodetector 216 and a signal processing unit (e.g., controller 206). Depending on the configuration, readout circuit 218 may include one or more of a transimpedance amplifier (TIA), an analog-to-digital converter (ADC), a time-to-digital converter (TDC), or the like.

Controller 206 may be configured to control integrated transmitter module 202 and/or receiver 204 to perform optical signal sensing/detection operations. For instance, controller 206 may control laser emitter 208 to emit laser beams 207, or control optics 210 to shape laser beams 207 into laser beams 209. In some embodiments, controller 206 may also be implemented to perform data acquisition and analysis functions. For instance, controller 206 may collect digitalized signal information from readout circuit 218, determine the distance of object 212 from LiDAR system 102 according to the travel time of laser beams, and construct a high-definition map or 3-D buildings or city modeling surrounding LiDAR system 102 based on the distance information of object(s) 212.

As illustrated in FIG. 2, controller 206 may be located outside chamber 203 of integrated transmitter module 202. Accordingly, controller 206 may communicate with transmitter components of integrated transmitter module 202 through connection pin(s) located on the outer surface of chamber 203, as further described in FIGS. 3-4.

In some embodiments, partial or full functions of controller 206 may be distributed to a similar component (e.g., a microcontroller) located inside the sealed chamber 203 of integrated transmitter module 202, inside receiver 204, or distributed to another local or remote computing device. Specific details regarding integrated transmitter module 202, including its communication with controller 206 of LiDAR system 102, are provided hereinafter with reference to FIGS. 3-5.

Figure 3:
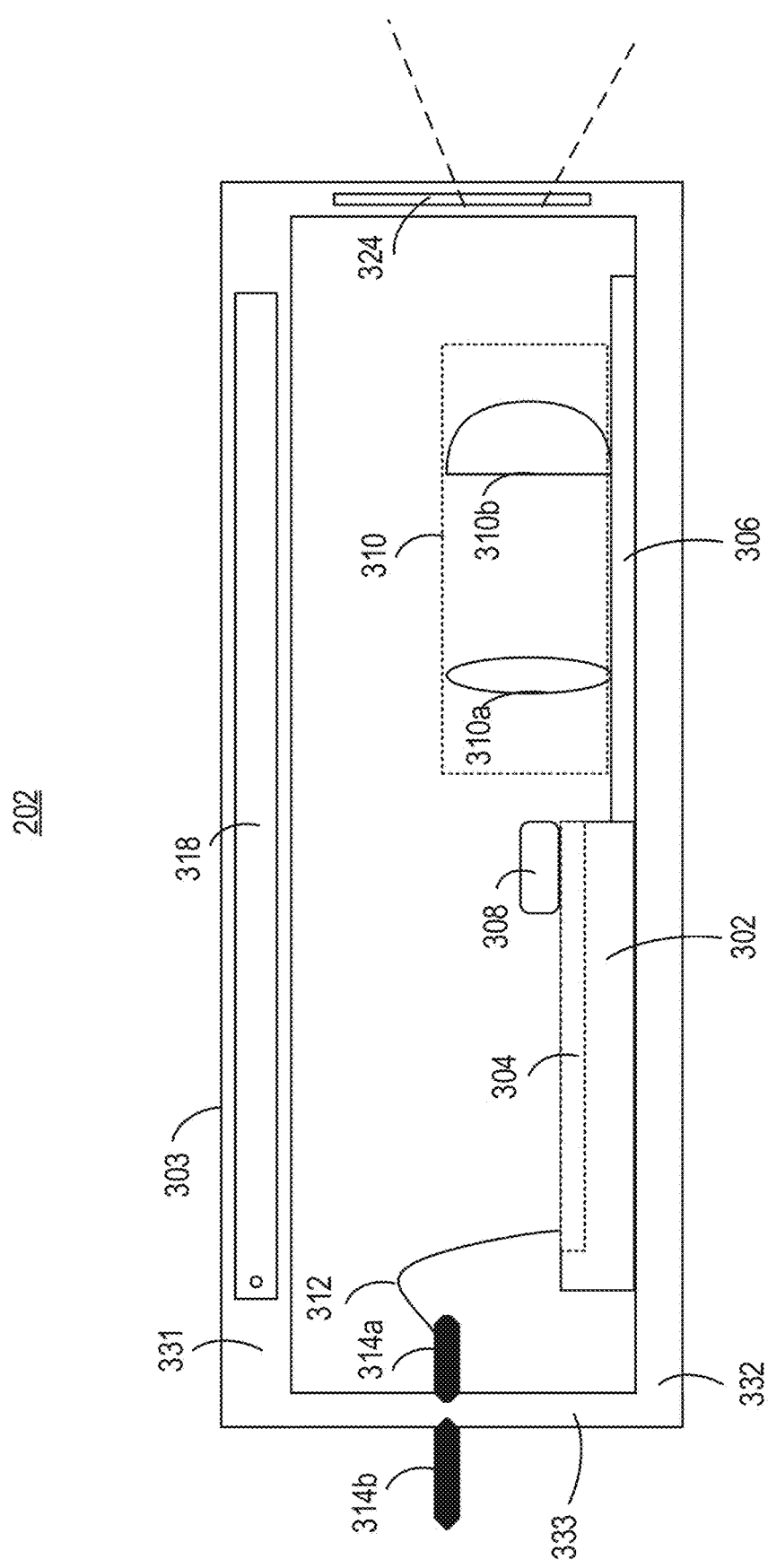
FIG. 3 illustrates a side view schematic diagram of an exemplary integrated transmitter module, according to embodiments of the present disclosure.

FIG. 3 illustrates a side view schematic diagram of an exemplary integrated transmitter module, according to embodiments of the present disclosure. As illustrated in FIG. 3, integrated transmitter module 202 may include a laser emitter 308, corresponding driving IC(s) 304, and one or more optics 310, all of which are included inside a chamber 303. Chamber 303 may be hermetically sealed after alignment of optics 310 with the laser source (e.g., laser emitter 308).

Laser emitter 308 may include a laser diode that emits an optical signal at a certain wavelength. The laser diode is a semiconductor device made of two different materials, i.e., a P-material and an N-material, sandwiched together. Forward electrical bias across the P-N junction causes the respective holes and electrons from opposite sides of the junction to combine, giving off a photon in the process of each combination. The electrical bias for the junction needs to be a stable, low-noise, transient free current source.

In some embodiments, to ensure the stability of the laser diode in the presence of varying environmental situations like temperature, vibration, and the aging of the laser itself, certain microprocessor monitor and/or control loops may be implemented as peripherals of the driving IC(s), to monitor and/or to control temperature, laser wavelength, laser power, etc., of the transmitter components. For example, a diode-pumped Nd laser may have servos to adjust the temperature and output power of the pump diodes to maintain stable output power from the resonator. In some embodiments, by encapsulating the laser diode and other transmitter components inside a hermetically sealed chamber as described herein, heat, vibration, and other effects may be controlled, and thus the stability and performance of the transmitter (e.g., an integrated transmitter module) in a LiDAR system may be further improved.

Driving IC(s) 304 may be configured to drive the laser diode in laser emitter 308 for modulating the intensity of an optical signal emitted by the laser diode. For instance, driving IC(s) 304 may be configured to adjust the emitting power level of the laser diode in laser emitter 308. The driver current of driving IC(s) 304 may be adjusted in order to drive the laser diode to emit laser beams at a varying emitting power level. In some embodiments, the varying driver current provided by driving IC(s) 304 is proportional to the dynamically varying emitting power level. Driving IC(s) 304 may be implemented using any suitable circuit topologies that could achieve the desired functions. For example, in some embodiments, driving IC(s) 304 may include a FET-controlled driver circuit or a capacitive discharge driver circuit.

In some embodiments, to facilitate the integration of transmitter components, driving IC(s) 304 and laser emitter 308 may be integrated onto a same PCB board 302, as illustrated in FIG. 3. Although not shown, other peripherals, including power monitoring chips, certain control chips, etc., may also be integrated onto/into the same PCB board 302. In this way, these components are not disposed as discrete packages like existing LiDAR systems, but rather integrated into a same package. This may shorten and/or reduce wire bondings between different transmitter components, and thus reduce loop inductances, thereby facilitating the achievement of laser beams with a narrower pulse and higher efficiency.

In some embodiments, to facilitate heat dissipation to prevent alignment drift, PCB board 302 may be a ceramic PCB that has high thermal conductivity and low expansion coefficient. Ceramic circuit boards are more versatile, less complex, and offer superior performance compared to regular PCBs. Materials used for a ceramic PCB board may include aluminum oxide ceramic ($Al_2O_3$), aluminum nitride ceramic (AlN), etc. After integrating laser emitter 308, driving IC(s) 304, and other peripherals onto/into PCB board 302, the PCB board 302 may be directly or indirectly fixed to an inner surface, such as the bottom surface of chamber 303, as described in more details in FIG. 4.

Optics 310 may include lens, mirrors, or other components that shape the light source to desired shapes (e.g. collimated shape, diverged shape, or any patterned shape). In one embodiment, as illustrated in FIG. 3, optics 310 may include a first lens 310a and a second lens 310b, where the first lens may be a fast axis collimator (FAC) and the second lens may be a slow axis collimator (SAC) according to one example. In some embodiments, one or more mirrors may be added along the light path of the emitted optical signal, to direct the optical signal toward a certain angle. Consistent with some embodiments, during transmitter components integration, the optical components (e.g., lens 310a and lens 310b) may not be fixed until alignment. That is, during integration, optical components 310 may be aligned first and fixed later.

In some embodiments, active alignment or other automatic alignments may be used for alignment of optics 310 with laser emitter 308. For instance, some mechanical arms or probes may be customized and used in active alignment. Briefly, these customized mechanical arms and probes may be controlled to extend into chamber 303 to manipulate optical components 310 through active alignment. Certain reflection board may be placed outside chamber 303 during optics alignment. Once aligned, these optical components 310 may then be fixed to a supporting structure right away, to prevent alignment drift. For instance, the optical components 310 may be fixed to a substrate 306 (also referred to as a "lens mount") that is pre-fixed to the bottom surface of chamber 303. By fixing optical components to substrate 306 instead of directly to the bottom surface of chamber 303, the stability of optical components 310 may be improved, since external force (e.g., due to an accident) on chamber 303 may be buffered/attenuated due to the existence of substrate 306. In some embodiments, PCB board 302 may also be fixed to substrate 306, but not directly to the bottom surface of chamber 303.

In some embodiments, to prevent alignment from drift due to environmental change, such as due to thermal expansion caused by temperature change, certain low-thermal-expansion materials may be selected for the construction of substrate 306. These low-thermal expansion materials may include certain fine ceramics, such as silicon nitride, aluminum nitride, aluminum oxide, silicon carbide, etc., among others. These low-thermal expansion materials may display little or no dimension change with changes in temperature, and thus when used in substrate 306, would greatly reduce the system-level alignment drift. In some embodiments, the material used for constructing substrate 306 may be the same as the material used for constructing PCB board 302. In this way, even there is some thermal effect, the system-level alignment drift may be minimized due to the same material used for supporting or holding laser emitter 308 and optical components 310. In some embodiments, after optics alignment and the fixing of optical components 310 onto substrate 306, chamber 303 may be hermetically sealed right away.

Chamber 303 may include a top portion 331, a bottom portion 332, and one or more surrounding walls 333. Top portion 331 may include an opening 318 (e.g., a door structure) that can allow mechanical arms to extend into chamber 303 to align optical components 310 with laser emitter 308. After alignment, opening 318 may be hermetically sealed. Bottom portion 332 may directly or indirectly hold and support different transmitter components, e.g., 304, 308, 310a, and 310b, on its inner surface, as described elsewhere herein. Sidewalls 333 may include one or more sidewalls, depending on the shape and structure of chamber 303. For instance, the sidewalls 333 may include only one piece if chamber 303 is a cylinder chamber or a dome-shaped chamber. If chamber 303 is box-shaped, chamber 303 may include four sidewalls. Other shaped chambers, e.g., an irregularly shaped chamber, are also possible, depending on the configurations.

In some embodiments, sidewalls 333 may further include a glass window or light filer 324 purposed for light emission, as illustrated in FIG. 3. If glass is used, the glass may need to sustain certain pressure if chamber 303 is a vacuum chamber. If a light filer is used, it may be selected from a material that is substantially transparent to light having wavelengths with a wavelength range covering laser emitted by laser emitter 308, and substantially opaque to light having wavelengths outside the wavelength range. For example, the light filter may allow light having a wavelength (e.g., 905 nm, 1550 nm, or the like) of the laser emitter 308 to propagate through the light filter. In some examples, the light filter may also be configured to prevent environmental damage to chamber 303, such as accumulation of dust or collision with airborne debris, among other possibilities. In some examples, the light filter may be configured to reduce visible light propagating through the light filter, reducing the visibility of the transmitter components inside chamber 303 from a perspective of an outside observer, thereby improving the aesthetic of LiDAR system 102.

In some embodiments, sidewalls 333 may further include one or more pins to establish communications between transmitter components inside chamber 303 and other components (e.g., controller 206) of LiDAR system 102 outside the chamber. For instance, one or more pins (e.g., pins 314a and/or 314b) may be disposed on one or both sides of a sidewall 333 at certain locations, as illustrated in FIG. 3. Inside chamber 303, one or more bonding wires 312 may be further disposed to connect driving IC(s) 304 with pin(s) on the inner surface of a sidewall 333. In some embodiments, pins 314a/314b may be disposed on top portion 331 or bottom portion 332, depending on the configurations of LiDAR system 102.

It is to be noted that the components illustrated in FIG. 3 are merely for exemplary purposes. Integrated transmitter module 202 may include fewer or more components than those illustrated in FIG. 3. For instance, integrated transmitter module 202 may include a plurality of laser emitters, as further described in FIG. 4.

Figure 4:
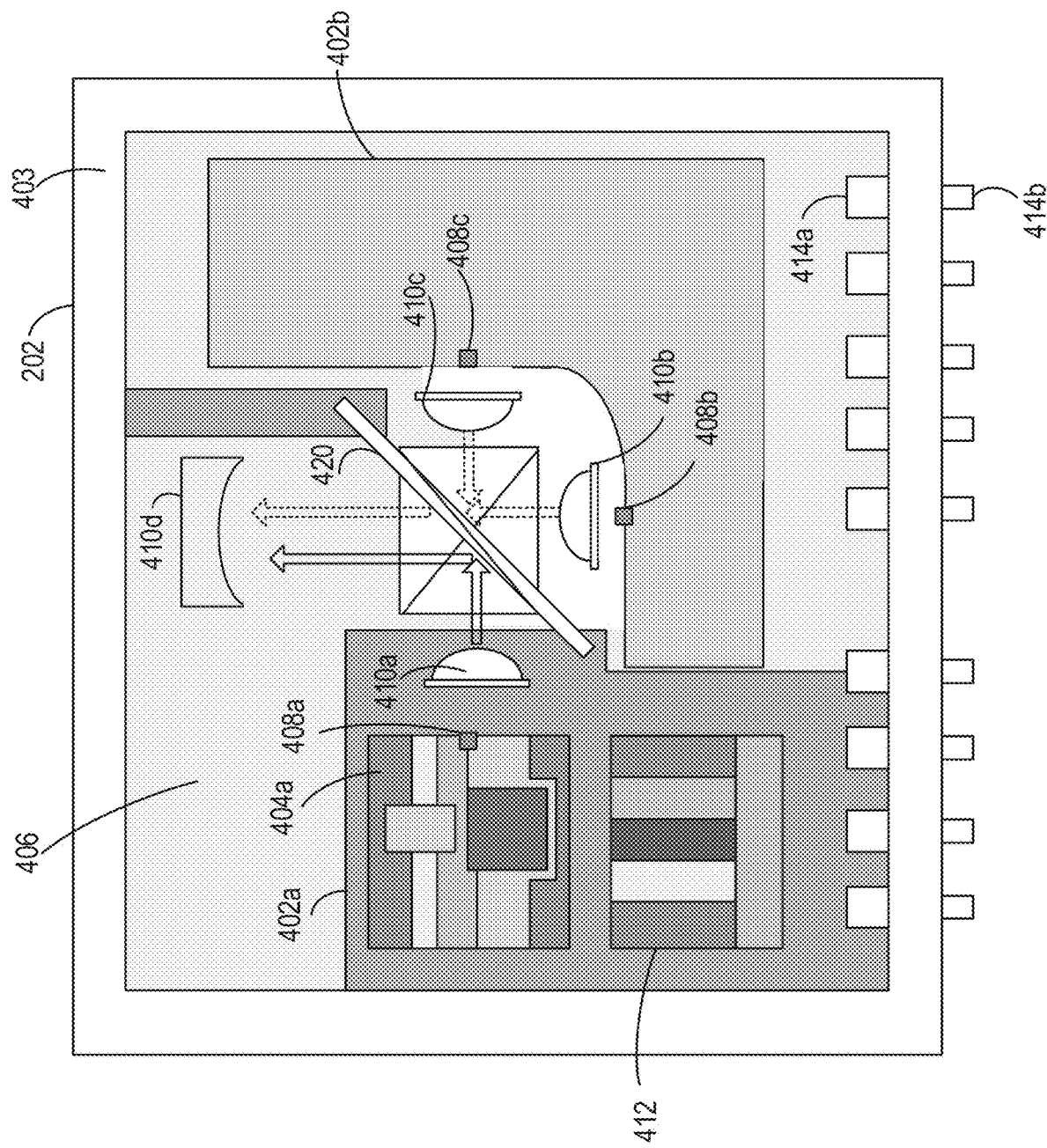
FIG. 4 illustrates a plan view schematic diagram of an exemplary integrated transmitter module, according to embodiments of the present disclosure.

FIG. 4 illustrates a plan view schematic diagram of an exemplary integrated transmitter module, according to embodiments of the present disclosure. As illustrated, integrated transmitter module 202 may include a laser emitter 408a, the corresponding driving IC(s) 404a, optics 410a and 410d, and a reflector 420 between optics 410a and 410d, all of which are integrated into a single package inside a chamber 403. In some embodiments, more than one laser emitter may be disposed into integrated transmitter module 202. For instance, as illustrated in FIG. 4, there may be three laser emitters 408a, 408b, and 408c in integrated transmitter module 202.

In some embodiments, different laser emitters may be located at different horizontal planes. For instance, among the three laser emitters 408a, 408b, and 408c, two laser emitters 408b and 408c may be in a same horizontal plane, while laser emitter 408a is in a different horizontal plane. That is, when compared to laser emitters 408b and 408c, laser emitter 408a may be at a different height with respect to the bottom inner surface of chamber 403. In some embodiments, for the two laser emitters 408b and 408c in the same horizontal plane, the two emitter laser beams may be combined (e.g., by a laser combining unit (not shown)) to form a combined laser beam with a higher power. This may facilitate the detection of objects in the environment at a large distance.

In some embodiments, if more than one laser beam is emitted from integrated transmitter module 202, these laser beams may have the same or different laser power, depending on the configurations of integrated transmitter module 202. For instance, the two laser emitters 408a and 408b may emit two laser beams with a different laser power. Alternatively, laser emitters 408a and 408b may also emit laser beams with a same laser power, depending on the configurations of LiDAR system 102.

In some embodiments, chamber 403 may also include one or more pins 414a and 414b located on the inner and outer surface of chamber 403. Although not illustrated, chamber 403 may also include an opening on the top surface of chamber 403 for optics alignment (e.g., through active alignment). In some embodiments, chamber 403 may also include a glass window or optical filter for laser emission, as previously described in FIG. 3.

In some embodiments, to integrate these different transmitter components, one or more PCB boards and/or substrates may be applied, similar to the descriptions for integrated transmitter module 202 in FIG. 3. For instance, laser emitter 408a and driving IC(s) 404a may be integrated onto a PCB board 402a. Certain peripherals 412 may be also integrated onto/into PCB 402a. Further, laser emitters 408b and 408c and their corresponding driving IC(s) and peripherals (not shown) may be integrated onto/into a separate PCB board 402b. Optical components 410a, 410b, 410c, and 410d, reflector 420, and laser combining unit (not shown) may be mounted onto a substrate 406 (some components may require alignment before the mounting). PCB boards 402a and 402b may be also mounted onto substrate 406, or directly fixed to the bottom inner surface of chamber 403. Substrate 406 may be further fixed to the bottom inner surface of chamber 403. In some embodiments, substrate 406 may itself become a part of the bottom inner surface of chamber 403.

It is to be noted that integrated transmitter module 202 illustrated in FIG. 4 is provided merely for exemplary purposes. The disclosed integrated transmitter module is not limited to the configuration in FIG. 4, and may include more or fewer components than those illustrated in the figure. For instance, while not shown, there may be a multi-laser combining unit that combines laser beams from multiple laser emitters, as previously discussed. For another instance, while not shown, there are some bonding wires for wire-bonding between different components (e.g., between laser emitters and peripherals and between peripherals and surrounding pins). Additionally, integrated transmitter module 202 may include certain sensors, monitors, and/or controllers that facilitate monitoring the power, emitted laser, temperature, and other health conditions of the integrated transmitter module, to better control the operation of the integrated transmitter module.

It is also to be noted that, there may be fewer or more than three laser emitters included in the sealed package for integrated transmitter module 202. For instance, in its simplest form, integrated transmitter module 202 may include only one laser emitter 408a (i.e., there is no laser emitter 408a or 408c as illustrated in the figure). For another instance, there may be four, five, six, or even a larger number of laser emitters in integrated transmitter module 202, to form a multi-channel laser source for the optical sensing system. If there are multiple laser emitters in integrated transmitter module 202, these laser emitters may emit laser beams with a same or different wavelength and with a same or different power.

In some embodiments, if there are multiple laser emitters in chamber 403, these multiple laser emitters may be arranged in a one-dimensional, two-dimensional, or three-dimensional array. For instance, a plurality of laser emitters may be organized stair-wise to allow the laser emitters to be stacked over the bottom inner surface of the integrated transmitter module, to form a three-dimensional array of multi-laser channels. Other arrangements of the multiple laser emitters are also possible and are contemplated here.

In some embodiments, hermetically sealing of integrated transmitter module 202 may include the formation of an airtight chamber 403 that prevents the passage of gases between the inside and outside of the chamber. In some embodiments, hermetically sealing of chamber 403 may further include removal or exchange of air (e.g., with nitrogen, noble gas, etc.) inside the chamber before, during, or after the sealing.

In some embodiments, different mechanisms may be applied for hermetic sealing, depending on the materials and structures used to make chamber 403. For instance, the materials used to make chamber 403 may be metal (e.g., aluminum), glass, ceramic, or other materials that can sustain a high pressure (e.g., under vacuum conditions). Depending on the material compositions of chamber 403 itself and the opening of the chamber, different mechanisms may be applied for hermetic sealing. For instance, a glass-to-metal hermetic seal may be applied for sealing glass and metal that are used to make the chamber and the corresponding door, respectively. When the glass and the metal being hermetically sealed have the same coefficient of thermal expansion, a "matched seal" derives its strength from the bond between the glass and the metal's oxide. "Compression seals" occur when the glass and the metal have different coefficients of thermal expansion such that the metal compresses around the solidified glass as it cools. Other hermetical seals, such as epoxy hermetic seals and ceramic-to-metal seals, may also be used.

In some embodiments, instead of permanent sealing, certain sealing mechanisms may be applied to allow the opening (e.g., a door) of chamber 403 to be reopened if necessary. For instance, under certain circumstances, optics re-alignment may be necessary if an extra force (e.g., due to an accident) affects the original alignment between laser emitters 408a/408b/40c and optics 410a/410b/410c. In this situation, the opening of chamber 403 that is originally sealed may be reopened to allow the optics to be re-aligned.

In some embodiments, after hermetically sealing each integrated transmitter module, a plurality of hermetically sealed integrated transmitter modules may be further organized together (e.g., stacked together), to serve as an even larger multi-channel laser source for LiDAR system 102. This may facilitate alignment between different channels of laser sources when there is a large number of channels required for the optical sensing system. For instance, instead of aligning thirty-six channels in a single chamber at the same time, six chambers each containing six channels may be aligned and hermetically sealed first. The aligned and hermetically sealed six chambers may be then stacked together, and the alignment is focused only on the six chambers in the next. In this way, the complexity of alignment for the total thirty-six channels may be greatly reduced.

In some embodiments, after being sealed as a single package, integrated transmitter module 202 may be further connected to other components (e.g., controller 206) of LiDAR system 102 through one or more pins, bonding wires, and the like that are located on the inner/outer surface of chamber 403. Communications between integrated transmitter module 202 and other components in the optical sensing system may be established. In this way, a LiDAR system containing an integrated transmitter module may be obtained, which may be applied to some specific optical sensing applications.

FIG. 5 is a flow chart of an exemplary optical sensing method performed by a LiDAR system containing an integrated transmitter module, according to embodiments of the disclosure. In some embodiments, method 500 may be performed by various components of LiDAR system 102, e.g., integrated transmitter module 202, receiver 204, and/or controller 206. In some embodiments, method 500 may include steps S502-S506. It is to be appreciated that some of the steps may be optional. Further, some of the steps may be performed simultaneously, or in a different order than that shown in FIG. 5.

In step S502, a laser transmitter module of an optical sensing system (e.g., integrated transmitter module 202 of LiDAR system 102) may emit an optical signal into an environment surrounding the optical sensing system. Here, the integrated transmitter module may contain a laser emitter (e.g., laser emitter 308) that emits the optical signal, one or more driving ICs (e.g., driving IC(s) 304) that drive the laser emitter to emit the optical signal, and one or more optics (e.g., optics 310a and 310b) that form the optical signal received from the laser emitter into a predefined shape and direct the optical signal having the predefined shape to the environment surrounding the optical sensing system.

Consistent with some embodiments, the laser emitter, the driving IC(s), and the one or more optics are integrated into a single package and are sealed in a chamber (e.g., chamber 303). According to one embodiment, the laser emitter and the driving IC(s) are integrated onto a PCB board fixed to the inner bottom surface of the chamber. The one or more optics are mounted onto a lens mount, which may also be fixed to the inner bottom surface of the chamber. In addition, the chamber may include one or more pins located on the inner and outer surfaces of the chamber, to establish a communication link with a controller (e.g., controller 106) of the optical sensing system outside the chamber. To emit the optical signal, the driving IC(s) inside the chamber may communicate with the controller outside the chamber (e.g., receiving a control signal from the controller) through the one or more pins, and then drive the laser emitter to emit an optical signal. The emitted signal may be received by the one or more optics also located inside the chamber. The one or more optics may form the optical signal received from the laser emitter into a predefined shape. The one or more optics may then direct the optical signal having the predefined shape to the environment surrounding the optical sensing system, e.g., by directing the optical signal towards a glass window or optical filer, located on a sidewall of the chamber. The glass window or optical filter may allow the optical signal to pass through the sidewall of the chamber to reach the environment outside the chamber. The optical signal emitted out of the chamber may reach the environment (e.g., hit an object in the environment). The outside environment (e.g., an object in the environment) may reflect the optical signal back to the optical sensing system.

In step S504, a photodetector (e.g., photodetector 216) of the optical sensing system may detect the optical signal reflected from the environment of the optical sensing system, and convert the detected optical signal to an electrical signal. For instance, a photosensor in the photodetector may detect the returned optical signal and convert the detected optical signal to an electrical signal reflecting the intensity of the detected optical signal. Depending on the configuration of the photodetector, the electrical signal may be a current or voltage signal. The electrical signal may be not ready for data analysis and thus is transmitted to a readout circuit (e.g., readout circuit 218) for further processing.

In step S506, the readout circuit (e.g., readout circuit 218) may convert the electrical signal to a digital signal for further processing. For instance, the readout circuit may include one or more of an ADC and TDC, which then converts the electrical signal to a digital signal. The digitalized signal may be forwarded to the controller (e.g., controller 206) of the optical sensing system for further processing. For instance, the digitalized signal may be transmitted to controller 206 of the optical sensing system for constructing a high-definition map or 3-D buildings and city modeling, etc.

Although the disclosure is made using a LiDAR system as an example, the disclosed embodiments may be adapted and implemented to other types of optical sensing systems that use receivers to receive optical signals, not limited to laser beams. For example, the embodiments may be readily adapted for optical imaging systems or radar detection systems that use electromagnetic waves to scan objects.

Another aspect of the disclosure is directed to a non-transitory computer-readable medium storing instructions which, when executed, cause one or more processors to perform the methods, as discussed above. The computer-readable medium may include volatile or non-volatile, magnetic, semiconductor-based, tape-based, optical, removable, non-removable, or other types of a computer-readable medium or computer-readable storage devices. For example, the computer-readable medium may be the storage device or the memory module having the computer instructions stored thereon, as disclosed. In some embodiments, the computer-readable medium may be a disc or a flash drive having the computer instructions stored thereon.

It is intended that the specification and examples be considered as exemplary only, with a true scope being indicated by the following claims and their equivalents.

The invention claimed is:

1. An optical sensing system, comprising:
an integrated transmitter module configured to emit an optical signal into an environment surrounding the optical sensing system,
wherein the integrated transmitter module comprises a laser emitter, one or more driving integrated circuits (ICs), and one or more optics integrated into a chamber that is hermetically sealed,
wherein a first set of pins is disposed on an inner surface of the chamber and electrically connected to the one or more driving ICs through a set of bonding wires,
wherein the one or more driving ICs and the laser emitter are integrated onto a printed circuit board (PCB), and
wherein the PCB and the one or more optics are mounted onto a substrate, and the PCB and the substrate are different components but comprise an identical material;
a photodetector configured to receive the optical signal reflected from the environment surrounding the optical sensing system and convert the received optical signal to an electrical signal; and
a readout circuit configured to convert the electrical signal to a digital signal,
wherein the photodetector and the readout circuit are located outside the chamber enclosing the integrated transmitter module.

2. The optical sensing system of claim 1, wherein the PCB is a ceramic PCB with a high thermal conductivity and a low expansion coefficient.

3. The optical sensing system of claim 1, wherein the one or more optics are aligned with the laser emitter.

4. The optical sensing system of claim 1, wherein the substrate comprises a lens mount fixed to the inner surface of the chamber.

5. The optical sensing system of claim 1, wherein the chamber is configured to enclose a predefined air composition inside the chamber.

6. The optical sensing system of claim 1, wherein the laser emitter comprises at least one of a single emitter, a multi-emitter unit, an emitter array, or an emitter stack.

7. The optical sensing system of claim 6, wherein:
when the laser emitter comprises the multi-emitter unit, the multi-emitter unit comprises a plurality of single emitters disposed in a single chip;
when the laser emitter comprises the emitter array, the emitter array comprises a plurality of single emitters disposed on a single substrate; and
when the laser emitter comprises the emitter stack, the emitter stack comprises a plurality of emitter arrays vertically or horizontally stacked together.

8. The optical sensing system of claim 1, wherein the chamber further comprises a second set of pins disposed on an outside surface of the chamber, the second set of pins establishing a communication link between the integrated transmitter module and a controller of the optical sensing system, wherein the controller is located outside the chamber.

9. The optical sensing system of claim 1, wherein the integrated transmitter module further comprises a monitoring component configured to monitor at least one of a laser power, a module temperature, or a wavelength of the emitted optical signal.

10. An optical sensing method, comprising:
emitting, by an integrated transmitter module of an optical sensing system, an optical signal into an environment surrounding the optical sensing system,
wherein the integrated transmitter module comprises a laser emitter, one or more driving integrated circuits (ICs), and one or more optics integrated into a chamber that is hermetically sealed,
wherein a first set of pins is disposed on an inner surface of the chamber and electrically connected to the one or more driving ICs through a set of bonding wires,
wherein the one or more driving ICs and the laser emitter are integrated onto a printed circuit board (PCB), and
wherein the PCB and the one or more optics are mounted onto a substrate, and the PCB and the substrate are different components but comprise an identical material;
detecting, by a photodetector of the optical sensing system, the optical signal reflected from the environment surrounding the optical sensing system;
converting, by the photodetector, the detected optical signal to an electrical signal; and
converting, by a readout circuit of the optical sensing system, the electrical signal to a digital signal, wherein the photodetector and the readout circuit are located outside the chamber enclosing the integrated transmitter module.

11. The optical sensing method of claim 10, wherein the PCB is a ceramic PCB with a high thermal conductivity and a low expansion coefficient.

12. The optical sensing method of claim 10, wherein the one or more optics are aligned with the laser emitter.

13. The optical sensing method of claim 10, wherein the substrate comprises a lens mount fixed to the inner surface of the chamber.

14. The optical sensing method of claim 10, wherein the chamber encloses a predefined air composition inside the chamber.

15. The optical sensing method of claim 10, wherein the laser emitter comprises at least one of a single emitter, a multi-emitter unit, an emitter array, or an emitter stack.

16. The optical sensing method of claim 10, further comprising:
establishing, by a second set of pins disposed on an outside surface of the chamber, a communication link between the integrated transmitter module and a controller of the optical sensing system, wherein the controller is located outside the chamber.

17. The optical sensing method of claim 10, further comprising:
monitoring, by a monitoring component of the integrated transmitter module, at least one of a laser power, a module temperature, or a wavelength of the emitted optical signal.

18. An integrated transmitter module for an optical sensing system, comprising:
a laser emitter configured to emit an optical signal to an environment surrounding the optical sensing system;
one or more driving integrated circuits (ICs) configured to drive the laser emitter to emit the optical signal; and
one or more optics configured to shape the optical signal into a predefined shape for emitting to the environment,
wherein the laser emitter, the one or more driving ICs, and the one or more optics are integrated into a hermetically sealed chamber,
wherein a set of pins is disposed on an inner surface of the chamber and electrically connected to the one or more driving ICs through a set of bonding wires,
wherein the one or more driving ICs and the laser emitter are integrated onto a printed circuit board (PCB), and
wherein the PCB and the one or more optics are mounted onto a substrate, and the PCB and the substrate are different components but comprise an identical material.

19. The integrated transmitter module of claim 18, wherein the PCB is a ceramic PCB with a high thermal conductivity and a low expansion coefficient.

20. The integrated transmitter module of claim 18, wherein the one or more optics are aligned with the laser emitter.

* * * * *